(12) United States Patent
Natsuaki et al.

(10) Patent No.: US 11,081,612 B2
(45) Date of Patent: Aug. 3, 2021

(54) AVALANCHE PHOTODIODE

(71) Applicant: SHARP KABUSHIKI KAISHA, Sakai (JP)

(72) Inventors: Kazuhiro Natsuaki, Sakai (JP); Takahiro Takimoto, Sakai (JP); Masayo Uchida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 519 days.

(21) Appl. No.: 15/776,065

(22) PCT Filed: Jun. 23, 2016

(86) PCT No.: PCT/JP2016/068629
§ 371 (c)(1),
(2) Date: May 14, 2018

(87) PCT Pub. No.: WO2017/094277
PCT Pub. Date: Jun. 8, 2017

(65) Prior Publication Data
US 2020/0259038 A1 Aug. 13, 2020

(30) Foreign Application Priority Data
Dec. 1, 2015 (JP) .............................. JP2015-235026

(51) Int. Cl.
*H01L 31/107* (2006.01)
*H01L 31/028* (2006.01)

(52) U.S. Cl.
CPC ...... *H01L 31/1075* (2013.01); *H01L 31/0284* (2013.01)

(58) Field of Classification Search
None
See application file for complete search history.

(56) References Cited

U.S. PATENT DOCUMENTS 3,590,345 A * 6/1971 Brewer ............... H01L 27/0821
257/547
4,117,507 A * 9/1978 Pacor ................... H01L 21/761
257/547
(Continued)

FOREIGN PATENT DOCUMENTS

CN 101911305 A 12/2010
JP H09-232556 A 9/1997
(Continued)

OTHER PUBLICATIONS

"Silicon Diffusivity Data" (Year: 2017).*

*Primary Examiner* — Evren Seven
(74) *Attorney, Agent, or Firm* — ScienBiziP, P.C.

(57) ABSTRACT

An avalanche photodiode includes: a first semiconductor layer of a first conductivity type formed on a substrate of the first conductivity type; a second semiconductor layer of a second conductivity type formed under the first semiconductor layer; a third semiconductor layer of the first conductivity type formed in a shallow portion of the first semiconductor layer on the substrate, the third semiconductor layer having a higher concentration than an impurity concentration of the first semiconductor layer; a fourth semiconductor layer of the first conductivity type formed in a region in the first semiconductor layer immediately below the third semiconductor layer; a first contact electrically connected to the first semiconductor layer; and a second contact electrically connected to the second semiconductor layer. An impurity concentration of the fourth semiconductor layer is higher than that of the first semiconductor layer and is lower than that of the third semiconductor layer.

5 Claims, 6 Drawing Sheets

(56) References Cited

U.S. PATENT DOCUMENTS

| | | | | |
|---|---|---|---|---|
| 4,814,852 | A | * | 3/1989 | Sundstrom .......... H01L 27/0772 257/510 |
| 5,656,835 | A | * | 8/1997 | Komobuchi .... H01L 31/022466 257/232 |
| 7,045,830 | B1 | * | 5/2006 | Cai ..................... H01L 29/7391 257/139 |
| 2008/0012087 | A1 | * | 1/2008 | Dautet .................. H01L 31/107 257/438 |
| 2009/0173966 | A1 | * | 7/2009 | Cai ...................... H01L 29/861 257/140 |
| 2010/0019295 | A1 | * | 1/2010 | Henderson ............ H01L 31/107 257/292 |
| 2011/0042717 | A1 | | 2/2011 | Cai |
| 2013/0099091 | A1 | * | 4/2013 | Nemirovsky ......... H01L 31/024 250/206 |
| 2013/0154044 | A1 | * | 6/2013 | Brunel ................... H01L 31/09 257/438 |
| 2013/0193546 | A1 | * | 8/2013 | Webster ................. H01L 31/18 257/438 |
| 2014/0291481 | A1 | * | 10/2014 | Zhang ................. H01L 27/1463 250/208.1 |
| 2015/0054111 | A1 | | 2/2015 | Niclass et al. |
| 2016/0043217 | A1 | * | 2/2016 | Cai ..................... H01L 27/0922 257/337 |

FOREIGN PATENT DOCUMENTS

| | | |
|---|---|---|
| JP | 2001-525117 A | 12/2001 |
| JP | 2015-041746 A | 3/2015 |
| WO | 98/00873 A1 | 1/1998 |

\* cited by examiner

AVALANCHE PHOTODIODE

TECHNICAL FIELD

The present invention relates to an avalanche photodiode, and more particularly relates to an avalanche photodiode with a good dark count rate.

BACKGROUND ART

Hitherto, an avalanche photodiode using the avalanche effect of a photodiode has been used as a light-receiving device that detects faint light at high speed in optical communication and time-of-flight (TOF) measurement. In response to application of a reverse bias voltage less than the breakdown voltage, an avalanche photodiode operates in linear mode, and the output current fluctuates so as to have a positive correlation with respect to the received light amount.

In contrast, in response to application of a reverse bias voltage greater than or equal to the breakdown voltage, an avalanche photodiode operates in Geiger mode. Because an avalanche phenomenon is caused in an avalanche photodiode in Geiger mode even in response to single photon incidence, a large output current is obtained. Therefore, an avalanche photodiode in Geiger mode is referred to as a single-photon avalanche diode (SPAD).

Voltage is applied across the cathode and the anode of an avalanche photodiode in above-described Geiger mode to control the electric field intensity to be greater than or equal to $3.0 \times 10^5$ V/cm. Accordingly, electric charge produced by faint light is amplified to output an electric signal, which is in reaction to a very small signal such as a single photon. In addition, an avalanche photodiode reacts to an optical signal in a very short time such as several psec and has excellent temporal resolution.

In contrast, because of its high amplification factor, even very small leakage current in response to application of a high electric field is amplified and output as noise other than a signal, which serves as a dark count rate.

To improve the leakage current characteristics (hereinafter referred to as noise tolerance) in order to reduce the dark count rate, not only a highly-doped P+ diffusion but also a lowly-doped P-well are used as the anode of a known avalanche photodiode, thereby increasing the width of a depletion layer and suppressing tunnel current. In this case, there is a problem that the electric field in a portion where the curvature of the diffusion shape of the outer periphery of the P-well is intensified, and avalanche amplification takes place only in the periphery, resulting in narrowing of the avalanche amplification region. Because the electric field intensity is low immediately below the P-well whose area is largest and no amplification occurs, there is a problem that the overall amplification factor is low.

Therefore, as illustrated in FIG. 11, there is an avalanche photodiode in which measures have been taken to increase the electric field intensity immediately below an N well whose area is largest (for example, see Japanese Unexamined Patent Application Publication No. 2015-41746 (PTL 1)). By forming a second semiconductor layer 203 of a second conductivity type (P-type layer) immediately below a first semiconductor layer 204 of a first conductivity type (N-well), the expansion of a depletion layer in a portion where the first semiconductor layer 204 and the second semiconductor layer 203 contact each other is suppressed, thereby increasing the electric field intensity. At this time, the depletion layer spreads beyond the second semiconductor layer 203 to a deep portion of an epitaxial layer 202.

In FIG. 11, reference numeral 200 denotes a chip; reference numeral 201 denotes a silicon substrate; reference numeral 202 denotes the epitaxial layer; reference numeral 205 denotes a third semiconductor layer; reference numeral 206 denotes a contact; reference numeral 207 denotes a contact; reference numeral 208 denotes a depletion region; reference numeral 211 denotes a region; reference numeral 213 denotes an electrode; reference numeral 214 denotes an interface; and reference numeral 215 denotes an embedded separation layer.

CITATION LIST

Patent Literature

PTL 1: Japanese Unexamined Patent Application Publication No. 2015-41746

SUMMARY OF INVENTION

Technical Problem

However, in the avalanche photodiode illustrated in FIG. 11, recombination current (leakage) at defects caused by dangling bond at the Si—$SiO_2$ interface or the like may deteriorate the dark count rate. Therefore, in PTL 1, a fourth semiconductor layer 212 of a conductivity type opposite from the first semiconductor layer 204 is formed on the surface to suppress the effects of the surface.

However, in the structure of the above-described avalanche photodiode, if the concentration of the fourth semiconductor layer 212 is increased in order to lower the anode resistance, there is a problem that very small recombination current (leakage) is caused by implantation defects at the time of high-concentration ion implantation or defects due to segregated impurities implanted with a concentration greater than or equal to the solid solubility, and accordingly, the dark count rate, which is noise in a no-signal state, is deteriorated.

It is an object of the present invention to provide an avalanche photodiode that can suppress leakage while lowering the anode resistance, and that can achieve good dark count rate characteristics.

Solution to Problem

In order to solve the above-described problem, an avalanche photodiode according to the present invention includes:

a first semiconductor layer of a first conductivity type formed on a substrate of the first conductivity type;

a second semiconductor layer of a second conductivity type opposite from the first conductivity type, the second semiconductor layer being formed under the first semiconductor layer;

a third semiconductor layer of the first conductivity type formed in a shallow portion of the first semiconductor layer on the substrate, the third semiconductor layer having a higher concentration than an impurity concentration of the first semiconductor layer;

a fourth semiconductor layer of the first conductivity type formed in a region in the first semiconductor layer immediately below the third semiconductor layer; a first contact electrically connected to the first semiconductor layer; and a second contact electrically connected to the second semiconductor layer, wherein an impurity concentration of the fourth semiconductor layer is higher than that of the first semiconductor layer and lower than that of the third semiconductor layer.

In addition, an avalanche photodiode according to an embodiment includes:

an electrode formed, with an insulating film provided therebetween, on a region that is on a lateral side of the first semiconductor layer on the substrate and that is between the first contact and the second contact.

In addition, in an avalanche photodiode according to an embodiment, the substrate is a silicon substrate of the first conductivity type, and the impurity concentration of the third semiconductor layer exceeds solid solubility into silicon.

In addition, in an avalanche photodiode according to an embodiment, the impurity concentration of the fourth semiconductor layer is a concentration not exceeding solid solubility.

In addition, in an avalanche photodiode according to an embodiment, it is configured such that a depletion layer does not spread beyond the fourth semiconductor layer toward the third semiconductor layer.

Advantageous Effects of Invention

As is clear from the above description, according to the present invention, an avalanche photodiode that can suppress leakage while lowering the anode resistance, and that can obtain good dark count rate characteristics can be realized.

DESCRIPTION OF EMBODIMENTS

<Basic Circuit Configuration>

At first, prior to describing an avalanche photodiode according to the present invention, a circuit configuration using a basic avalanche photodiode will be described using FIGS. 1 and 2.

Figure 1:
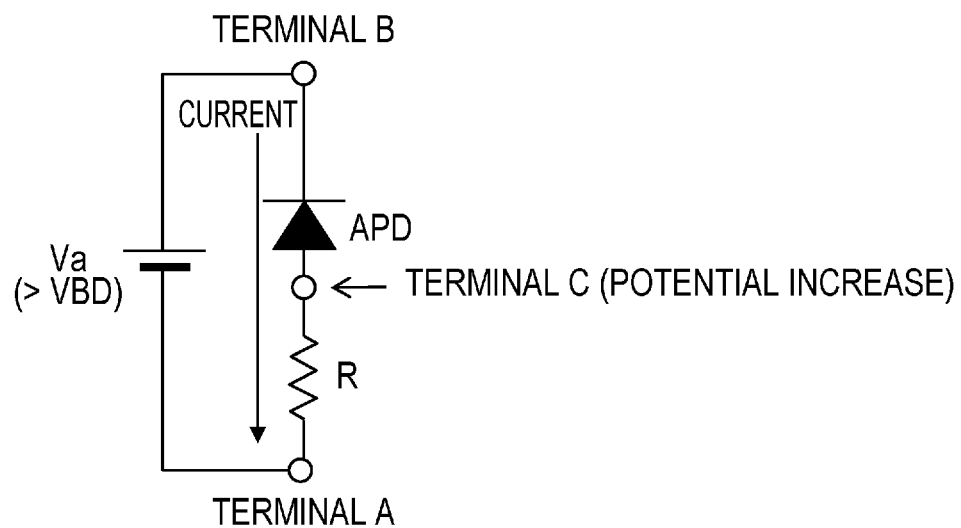
FIG. 1 is a diagram illustrating an example of a circuit configuration using an avalanche photodiode.
Figure 2:
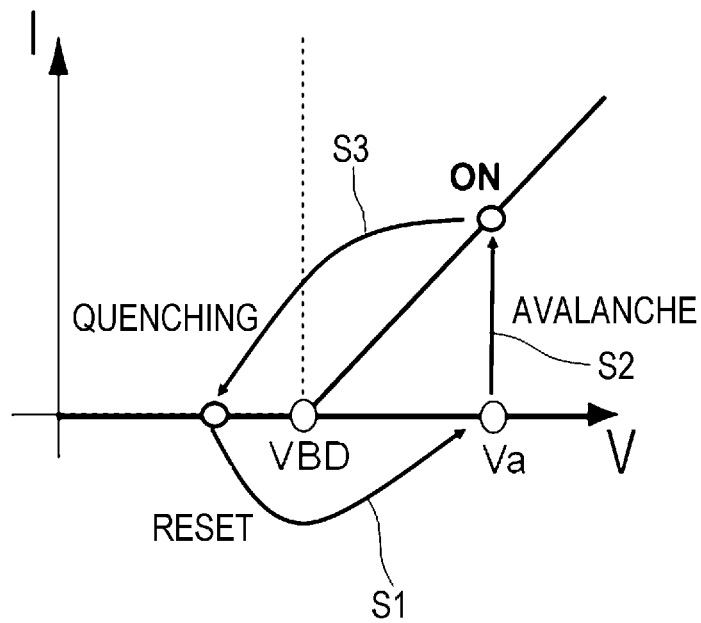
FIG. 2 is a diagram illustrating the description of the operation in Geiger mode.

FIG. 1 illustrates an example of a circuit configuration using an avalanche photodiode APD, and FIG. 2 illustrates the description of the operation in Geiger mode. This avalanche photodiode APD has two operating modes, which are distinguished by the relationship between breakdown voltage and applied voltage.

The first operating mode is the operating mode in the case of "breakdown voltage<applied voltage" and is referred to as avalanche mode.

The second operating mode is the operating mode in the case of "breakdown voltage>applied voltage" and is referred to as Geiger mode. In the operation in Geiger mode, when a very small signal such as photon is input, the signal is greatly amplified to obtain a large output. However, with the diode alone, current remains amplified and is not restored.

Therefore, as illustrated in FIG. 1, the avalanche photodiode APD is used by connecting a resistor R in series with the avalanche photodiode APD. More specifically, one of two ends of the resistor R is connected to a terminal C at the anode side of the avalanche photodiode APD, and the other end of the resistor R is connected to a terminal A. A load of direct current (DC) power source Va is connected to the terminal A, and the positive electrode of the DC power source Va is connected to a terminal B at the cathode side of the avalanche photodiode APD.

In this case, when constant current flows through the avalanche photodiode APD, voltage applied to the resistor R increases, thereby reducing the voltage of the avalanche photodiode APD to be less than or equal to the breakdown voltage. Thus, the current can be restored to a state before the signal input. The resistor R is referred to as a quenching resistor. Such an operation will be described using FIG. 2 from the relationship between voltage and current.

In FIG. 2, the horizontal axis represents voltage [arbitrary scale], and the vertical axis represents current [arbitrary scale]; and "VBD" represents voltage at breakdown of the avalanche photodiode APD. The state changes to "Va" by increasing voltage applied to the avalanche photodiode APD (S1). When there is no signal at this time, there will be no current output. When a very small optical signal such as photon is input here, the signal is amplified (S2), the current increases to be "ON", and an output signal is obtained. In addition, however, current flowing through the quenching resistor illustrated in FIG. 1 instantly increases, the voltage applied to the avalanche photodiode APD decreases (S3), and the state returns to a "reset" state. By repeating this operation, an output signal can be obtained in response to a signal input.

Because the avalanche photodiode APD has a high amplification factor as descried above, there is a problem that very small leakage current in the avalanche photodiode APD itself is also amplified and is output.

Figure 3A:
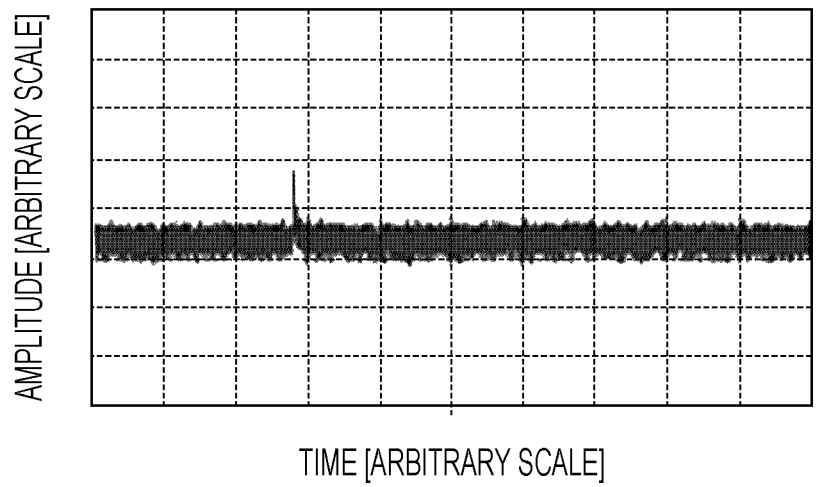
FIG. 3A is a diagram illustrating dark pulses when there is no signal in Geiger mode.
Figure 3B:
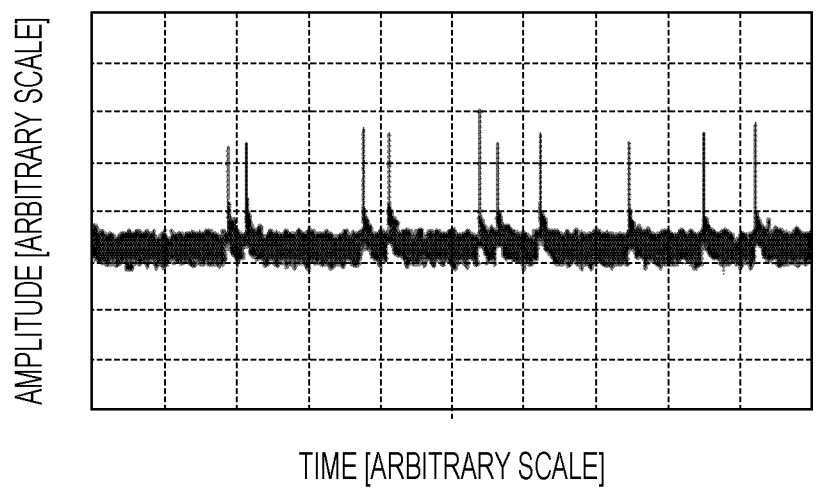
FIG. 3B is a diagram illustrating dark pulses when there is no signal in Geiger mode.

FIGS. 3A and 3B illustrate the results of observing, along with the passage of time, pulse outputs when there is no signal.

There is substantially no output from an ideal avalanche photodiode illustrated in FIG. 3A. In contrast, many pulse outputs are observed, along with the passage of time, from an avalanche photodiode illustrated in FIG. 3B, and these pulse outputs are referred to as dark pulses. If there are too many dark pulses, it will be difficult to distinguish them from an output signal. Thus, this becomes one of the important characteristics among avalanche photodiode characteristics. The number of pulses per second is counted, and this number of pulses is referred to as a "dark count rate" and is represented by the unit "Hz".

The probability that dark pulses of the avalanche photodiode occurs influences not only leakage current, but also the amplification factor of the device. Thus, the probability also depends on the applied voltage "excess bias Vex" greater than or equal to the breakdown voltage. In contrast, the amplification factor of an input signal also increases depending on the excess bias Vex. Thus, a device whose dark count rate (hereinafter referred to as DCR) is difficult to increase even when the excess bias voltage Vex is increased is considered to be a good avalanche photodiode.

Hereinafter, an avalanche photodiode according to the present invention will be described in more detail using illustrated embodiments. In the drawings, the same reference numeral represents the same portion or a corresponding portion. The dimensions such as length, width, thickness, and depth on the drawings are appropriately changed from the actual scale for the sake of clarity and convenience of the drawings and do not represent the actual relative dimensions.

First Embodiment

The configuration of an avalanche photodiode according to a first embodiment of the present invention will be described with reference to FIG. 4.

Figure 4:
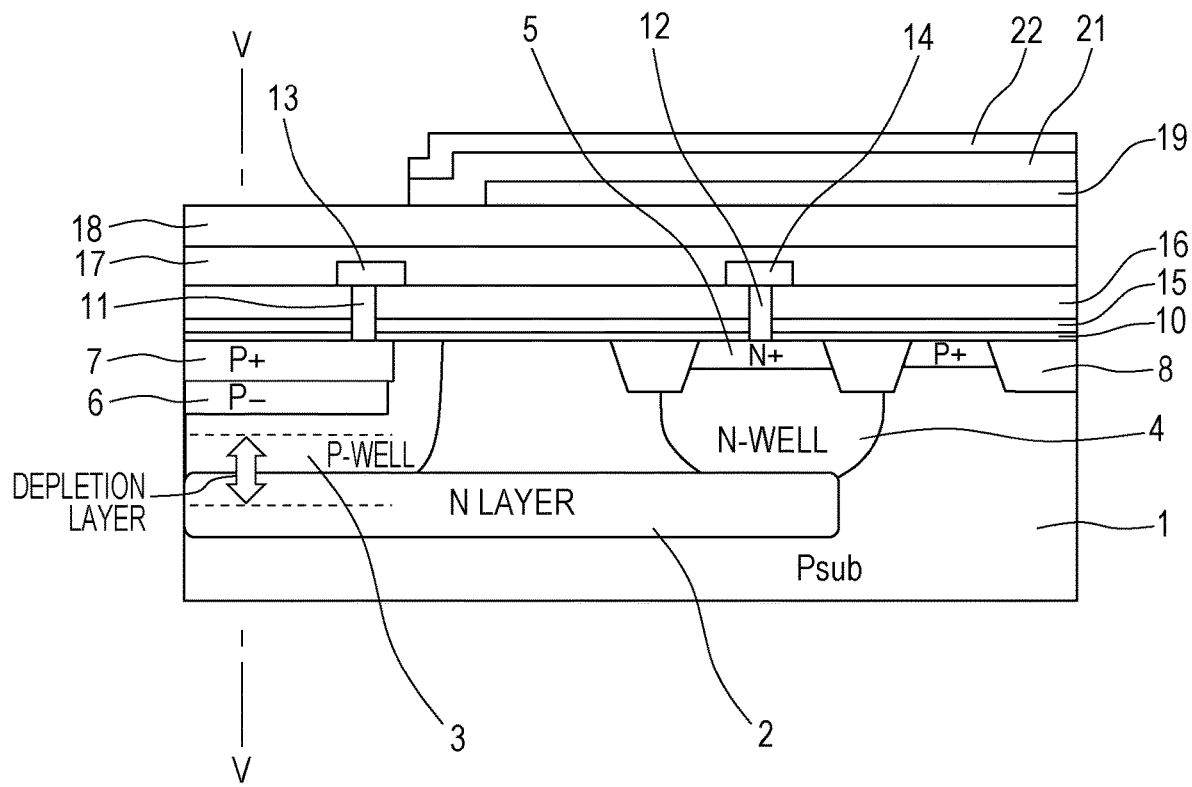
FIG. 4 is a diagram illustrating the cross-sectional structure of an avalanche photodiode according to a first embodiment of the present invention.

FIG. 4 is a cross-sectional view illustrating the configuration of the avalanche photodiode according to the first embodiment. In FIG. 4, reference numeral 8 denotes a selective oxide film STI (shallow trench isolation) for isolating the device by insulation; reference numeral 15 denotes a plasma SIN film; reference numeral 16 denotes a BPSG (Boron Phosphorus Silicon Glass) film; reference numeral 17 denotes an inter-layer HDP (High Density Plasma) film; reference numeral 18 denotes an inter-layer TEOS (Tetra Ethoxy Ortho Silicate); reference numeral 19 denotes a second-layer wiring metal; reference numeral 21 denotes a cover oxide film; and reference numeral 22 denotes a cover SIN film.

This avalanche photodiode is configured by a PN junction, as illustrated in FIG. 4. That is, a P-well layer 3 is provided with a concentration of $1\times10^{17}$ cm$^{-3}$ at a depth of about 2 μm on the upper side of a P-type silicon substrate 1 with a specific resistance of about 10 Ωcm. The P-well layer 3 is an example of a first semiconductor layer. To spread a depletion layer, the lower the concentration, the better. The concentration may be about $1\times10^{16}$ cm$^{-3}$, which is close to the substrate concentration. For example, like the silicon substrate, the P-well layer 3 may be configured using a compound semiconductor substrate, such as SiC or InGaAs.

To reduce the anode resistance and to reduce the contact resistance when forming a first contact 11 thereafter, a highly-doped P+ layer 7 is formed with a concentration of about $1\times10^{21}$ cm$^{-3}$ on the surface of the P-well layer 3. The P+ layer 7 is an example of a third semiconductor layer.

The P-well layer 3 and the P+ layer 7 function as the anode of the PN junction.

In contrast, an N layer 2 is provided with a concentration of about $2\times10^{17}$ cm$^{-1}$ immediately below the P-well layer 3 so as to overlap the P-well layer 3. The N layer 2 is an example of a second semiconductor layer.

To apply application voltage to the N layer 2, an N-well layer 4 is provided with a concentration of about $2\times10^{17}$ cm$^{-3}$ at a depth of about 2 μm from the surface of the silicon substrate 1. The N-well layer 4 is formed horizontally away from the P-well layer 3 by a desired distance.

If the P-well layer 3 and the N-well layer 4 are too close to each other, the electric field in the horizontal direction becomes strong, resulting in a diode where avalanche amplification occurs just around the PN junction forming the avalanche photodiode. To avoid this, the P-well layer 3 and the N-well layer 4 are formed at a distance of, for example, about 2 μm, thereby preventing the intensity of the electric field on the lateral surface of the P-well layer 3 from becoming strong.

To reduce the contact resistance of a second contact 12 formed thereafter, an N+ layer 5 containing highly-doped phosphorous impurities is provided on the surface of the N-well layer 4.

In response to application of voltage across the P-well layer 3 and the N-well layer 4 via the first contact 11 and the second contact 12, the depletion layer spreads vertically from the PN junction portion. As it is, the depletion layer becomes close to the highly-doped P+ layer 7 and reaches the vicinity of the surface. Because the P+ layer 7 has ion implantation defects or defects due to segregated impurities exceeding the solid solubility into silicon, if the depletion layer reaches the P+ layer 7 and leakage current is taken into the depletion layer, the number of dark pulses increases and the characteristics deteriorate.

To prevent this, a P− layer 6 whose concentration (such as $5\times10^{18}$ cm$^{-3}$) is lower than that of the P+ layer 7 but is higher than that of the P-well layer 3, not exceeding the solid solubility, is provided immediately below the P+ layer 7. The P− layer 6 is an example of a fourth semiconductor layer. At this time, it is known that leakage caused by crystal defects increases when the concentration exceeds $1\times10^{19}$ cm$^{-3}$. Thus, it is preferable that the concentration be less than or equal to $1\times10^{19}$ cm$^{-3}$.

Accordingly, the depletion layer spreading from the PN junction does not spread beyond the P− layer 6 and does not become close to the P+ layer 7.

The first contact 11 using a tungsten plug for taking potential is provided on the P+ layer 7, and a first-layer wiring metal 13 (anode electrode) made of AlCu is provided. The second contact 12 using a tungsten plug for taking potential is provided on the N+ layer 5, and a first-layer wiring metal 14 (cathode electrode) made of AlCu is provided. If necessary, a laminated film of Ti/TiN or the like made of a high melting point metal and AlCu may be used.

The avalanche photodiode is activated by applying application voltage to the first-layer wiring metal 13 (anode electrode) and the first-layer wiring metal 14 (cathode electrode).

Figure 5:
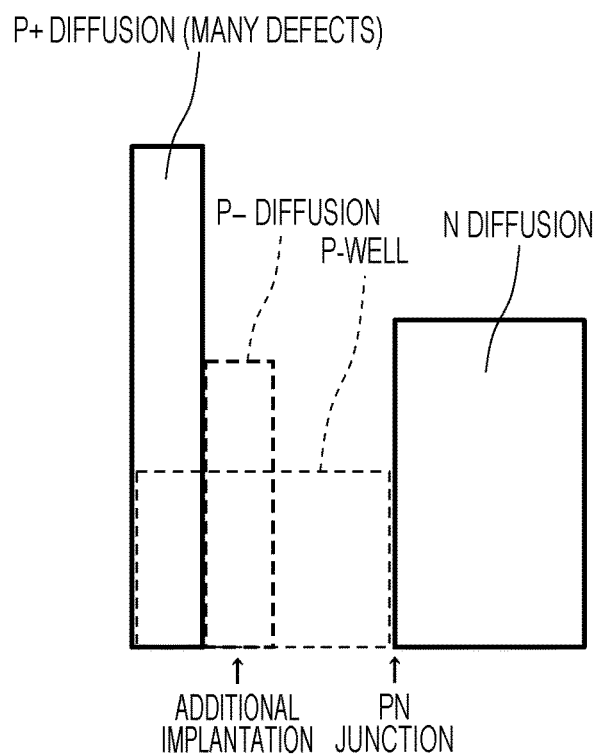
FIG. 5 is a conceptual diagram of a concentration profile at the V-V cross section of the above-mentioned avalanche photodiode.
Figure 6:
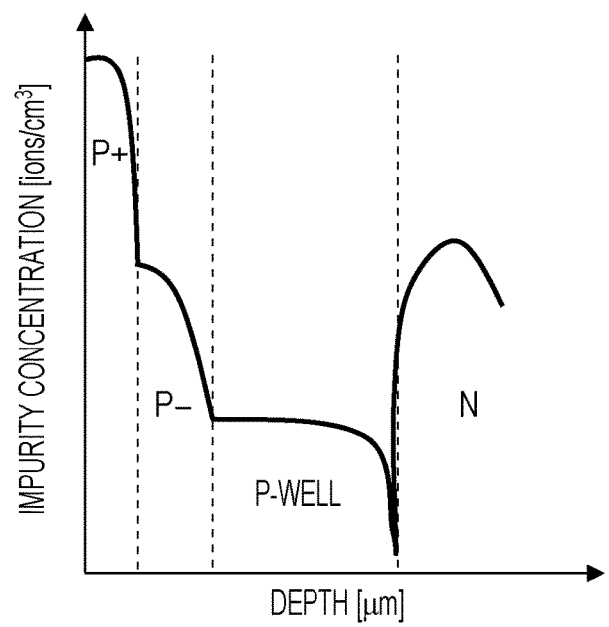
FIG. 6 is a diagram illustrating a concentration profile at the V-V cross section of the avalanche photodiode according to the first embodiment of the present invention.

FIG. 5 is a conceptual diagram of a concentration profile at the V-V cross section of the above-described avalanche photodiode, and FIG. 6 illustrates a concentration profile at the V-V cross section of the above-described avalanche photodiode.

In FIG. 5, the horizontal direction represents the depth direction of the silicon substrate 1. The leftward direction corresponds to the front side where the P+ layer 7 is formed, and the rightward direction corresponds to the back side. In addition, the vertical direction in FIG. 5 represents the impurity concentration.

In addition, in FIG. 6, the horizontal axis represents the depth [μm] (the depth direction of the silicon substrate 1), and the vertical axis represents the impurity concentration [ions/cm$^3$].

As illustrated in FIGS. 5 and 6, the P+ layer 7 is formed on the front side of the P-well layer 3, and the P− layer 6 whose concentration is lower than that of the P+ layer 7 but is higher than that of the P-well layer 3 is formed immediately below the P+ layer 7.

Figure 7:
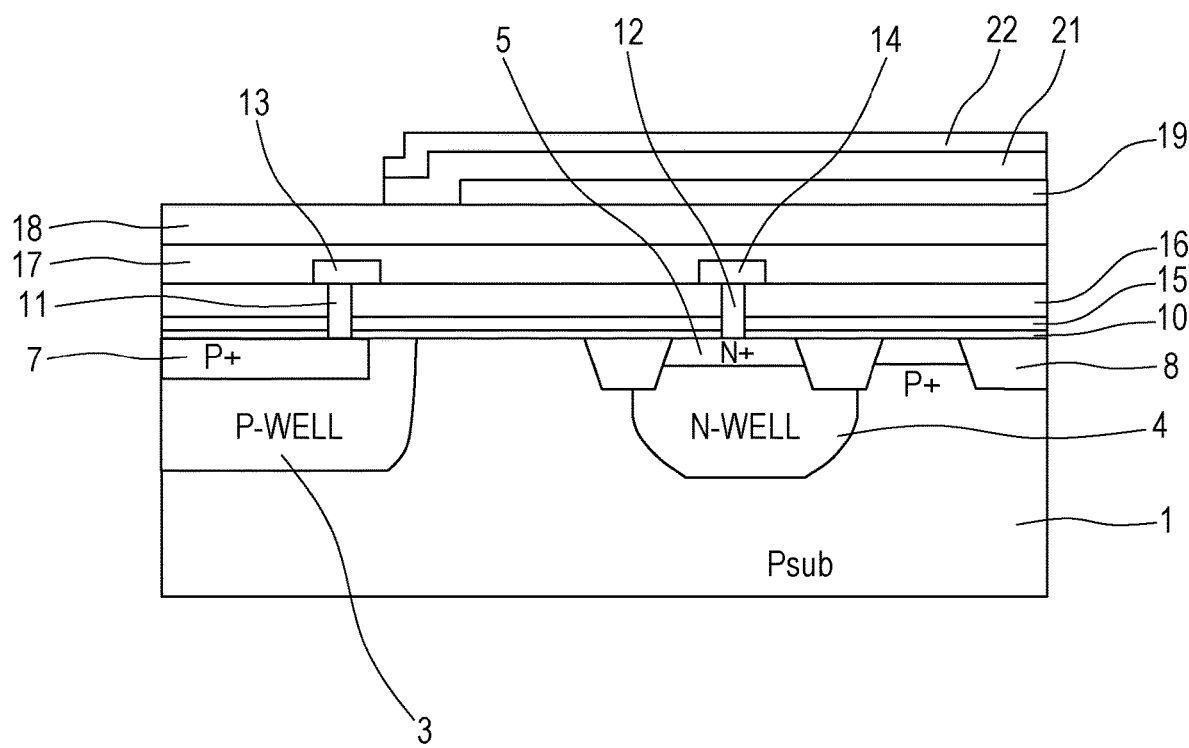
FIG. 7 is a diagram illustrating the structure of an avalanche photodiode according to a comparative example.

FIG. 7 illustrates the structure of an avalanche photodiode according to a comparative example. The avalanche photodiode according to the comparative example is different from the first embodiment in the point that there is no embedded N layer and that there is no P− layer under the P+ layer. In FIG. 7, the same configuration portion as that of the avalanche photodiode according to the first embodiment is given the same reference numeral.

Figure 8:
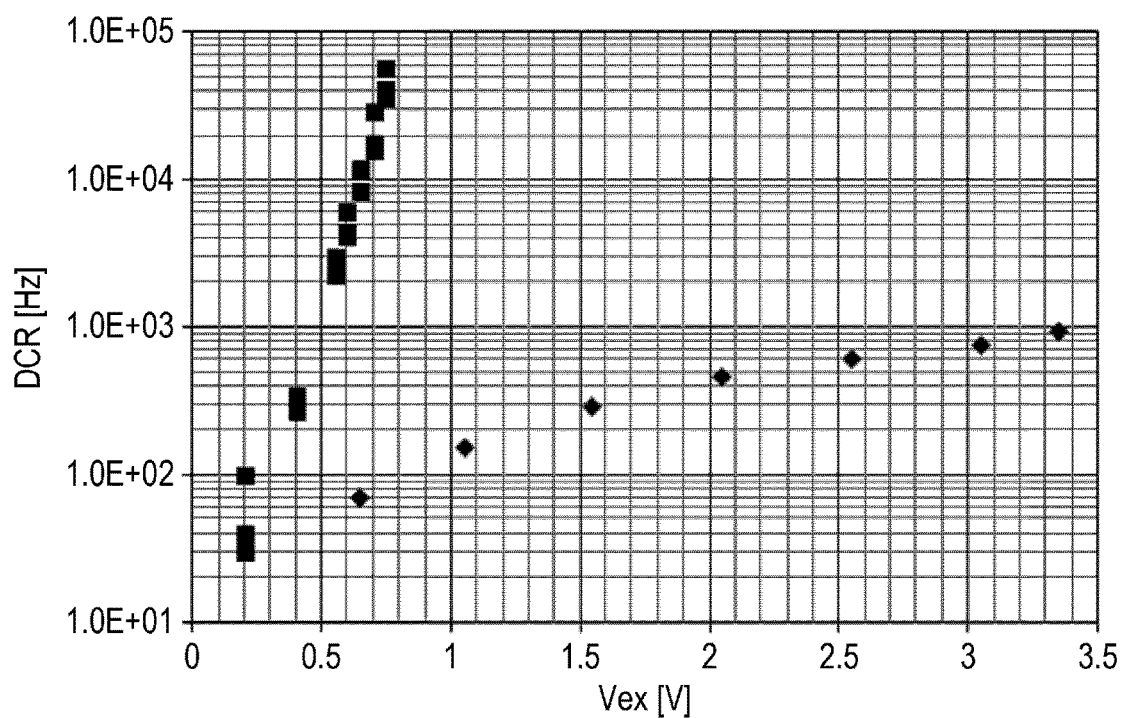
FIG. 8 is a diagram illustrating the excess bias Vex dependence of the dark count rate (DCR) of the above-mentioned avalanche photodiode.

FIG. 8 illustrates data representing the comparison of the excess bias Vex dependence of the DCR of the avalanche photodiode according to the above-described first embodiment and the avalanche photodiode according to the comparative example illustrated in FIG. 7.

In FIG. 8, the horizontal axis represents the excess bias Vex [V], and the vertical axis represents the DCR [Hz]. Here, "■" represent the DCR of the avalanche photodiode according to the comparative example. The DCR increases as the excess bias Vex becomes higher. By increasing the excess bias Vex, the depletion layer spreads to the vicinity of the surface of the P+ layer and takes in leakage current. At the same time, the amplification factor increases, and the current becomes greater and is output. In the case of low applied voltage, even if the depletion layer does not hit the P+ layer, when the excess bias Vex is increased, there is a problem that the depletion layer spreads to the vicinity of the surface of the P+ layer and eventually hits the P+ layer.

In contrast, the DCR characteristics of the avalanche photodiode according to the first embodiment of the present invention are represented by "♦" in FIG. 8. The DCR characteristics of the avalanche photodiode according to the first embodiment are such that, although the DCR increases somewhat as the excess bias Vex becomes higher, the DCR tends to saturate and does not increase anymore. This is because, although the depletion layer spreads to the P− layer 6 formed immediately below the P+ layer 7, the depletion layer does not spread anymore.

According to the avalanche photodiode with the above-described configuration, the depletion layer spreads to the P-well layer 3 (first semiconductor layer) and the N layer 2 (second semiconductor layer) in response to application of high voltage across the P-well layer 3 and the N layer 2. Because there is the P− layer 6 (fourth semiconductor layer) of the first conductivity type, the depletion layer does not spread to the P+ layer 7 (third semiconductor layer), which is formed on the substrate surface and which has a high impurity concentration, and the depletion layer does not directly contact the P+ layer 7. Accordingly, the dark count rate does not increase even when the P+ layer 7 is formed with a high concentration in a shallow region on the surface in order to reduce the anode resistance. Therefore, leakage can be suppressed, and good dark count rage characteristics can be achieved.

In addition, it is preferable that the P+ layer 7 for reducing the anode resistance, which is formed on the surface of the above-described silicon substrate 1, be subjected to ion implantation exceeding the solid solubility into silicon in order to secure a sufficient impurity concentration.

Because the impurity concentration of the above-described P− layer 6 is a concentration that does not cause segregation of impurities due to ion implantation exceeding the solid solubility, recombination current caused by defects due to segregated impurities does not occur, and the dark count rate is not deteriorated even when the depletion layer contacts the P− layer 6.

In addition, when the avalanche photodiode is configured such that the depletion layer does not spread beyond the P− layer 6 toward the P+ layer 7, the electric field intensity can be controlled by controlling the width of the depletion layer, and the stable amplification factor can be secured.

Second Embodiment

The configuration of an avalanche photodiode according to a second embodiment of the present invention will be described with reference to FIG. 9.

Figure 9:
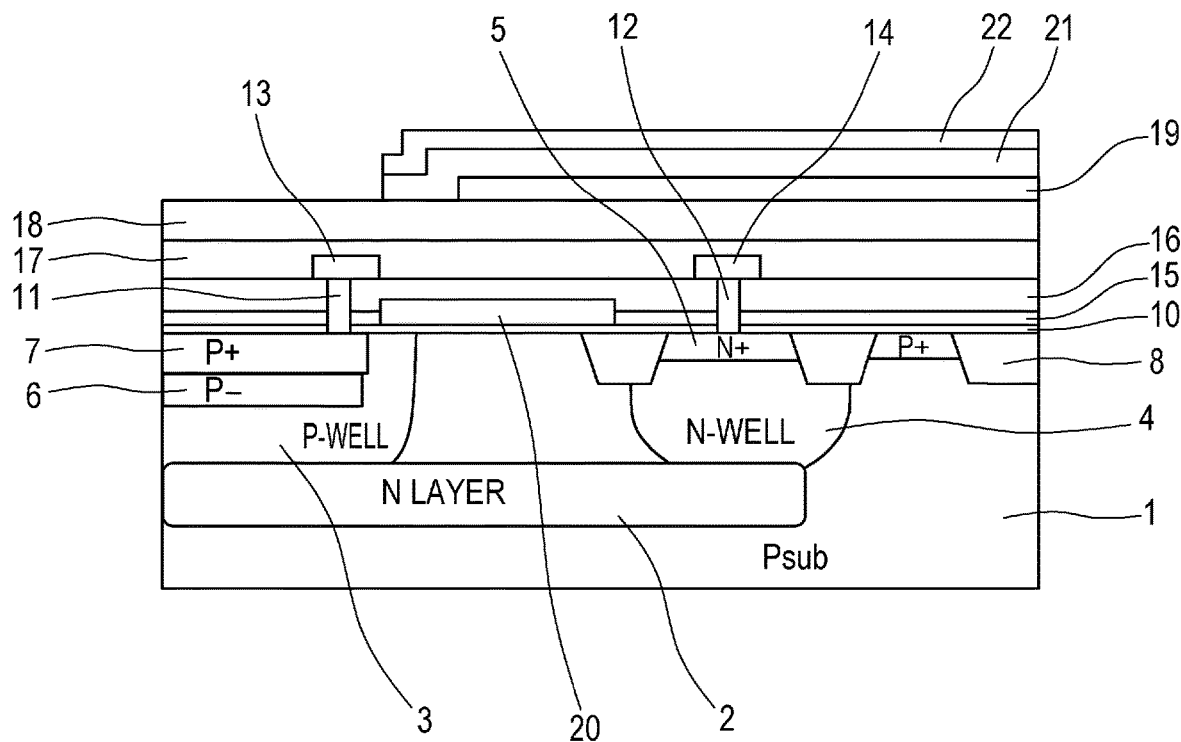
FIG. 9 is a diagram illustrating the cross-sectional structure of an avalanche photodiode according to a second embodiment of the present invention.

FIG. 9 is a cross-sectional view illustrating the configuration of the avalanche photodiode according to the second embodiment. In FIG. 9, the same configuration portion as that of the avalanche photodiode according to the first embodiment is given the same reference numeral.

Like the first embodiment, the avalanche photodiode according to the second embodiment is configured by a PN junction, as illustrated in FIG. 9. That is, the P-well layer 3 is provided with a concentration of $1\times10^{17}$ cm$^{-3}$ at a depth of about 2 m on the upper side of the P-type silicon substrate 1 with a specific resistance of about 10 Ωcm. The P-well layer 3 is an example of a first semiconductor layer.

To reduce the anode resistance and to reduce the contact resistance when forming a contact thereafter, the highly-doped P+ layer 7 is formed with a concentration of about $1\times10^{21}$ cm$^{-3}$ on the surface of the P-well layer 3. The P+ layer 7 is an example of a third semiconductor layer.

The P-well layer 3 and the P+ layer 7 function as the anode of the PN junction.

In contrast, the N layer 2 is provided with a concentration of about $2\times10^{17}$ cm$^{-3}$ immediately below the P− well layer 3 so as to overlap the P-well layer 3. The N layer 2 is an example of a second semiconductor layer.

To apply application voltage to the N layer 2, the N-well layer 4 is provided with a concentration of about $2\times10^{17}$ cm$^{-3}$ at a depth of about 2 μm from the surface of the silicon substrate 1. The N-well layer 4 is formed horizontally away from the P-well layer 3 by a desired distance.

If the P-well layer 3 and the N-well layer 4 are too close to each other, the electric field in the horizontal direction becomes strong, resulting in a diode where avalanche amplification occurs just around the PN junction forming the avalanche photodiode.

To avoid this, the P-well layer 3 and the N-well layer 4 are formed at a distance of, for example, about 2 μm, thereby preventing the intensity of the electric field on the lateral surface of the P-well layer 3 from becoming strong.

In addition, a polysilicon electrode 20 (wiring layer) formed of polysilicon is arranged on the front side, with an insulating film 10 provided therebetween, between the P-well layer 3 and the N-well layer 4.

Accordingly, two advantageous effects are achieved.

The first advantageous effect is that desired potential can be applied to the surface between the P-well layer 3 and the N-well layer 4 by applying desired potential to the polysilicon electrode 20.

For example, in the case of FIG. 9, because the P+ layer 7 is formed on the surface, P-type semiconductor can apply potential in an N-inverting direction by applying positive potential to the polysilicon electrode 20 and applying potential to the surface of the silicon substrate 1. Accordingly, the surface concentration, which tends to be unstable, can be controlled, and the electric field intensity on the surface of the silicon substrate 1 can be weakened.

The second advantageous effect is that the influence of a wiring layer formed on the front side above the polysilicon layer is alleviated. If negative potential is applied to the polysilicon electrode 20, this potential may cause a P-type semiconductor layer on the surface of the silicon substrate 1 to change further to the P+ side, thereby intensifying the electric field intensity on the lateral surface of the P-well layer 3. By fixing the polysilicon electrode 20 at the same potential as, for example, the first-layer wiring metal 14 (cathode electrode), the influence of a wiring layer wired on the front side above the polysilicon electrode 20 can be eliminated.

To reduce the contact resistance of a contact electrode formed thereafter, the N+ layer 5 containing highly-doped phosphorous impurities is provided on the surface of the N-well layer 4. In response to application of voltage across the P-well layer 3 and the N-well layer 4, the depletion layer spreads vertically from the PN junction portion. As it is, the depletion layer becomes close to the highly-doped P+ layer 7 and reaches the vicinity of the surface. Because the P+ layer 7 has ion implantation defects or defects due to segregated impurities exceeding the solid solubility, if the depletion layer reaches the P+ layer 7 and leakage current is taken into the depletion layer, the number of dark pulses increases and the characteristics deteriorate.

To prevent this, the P− layer 6 whose concentration (such as about $5 \times 10^{18}$ cm$^{-3}$) is lower than that of the P+ layer 7 but is higher than that of the P-well layer 3, not exceeding the solid solubility, is provided immediately below the P+ layer 7. The P− layer 6 is an example of a fourth semiconductor layer.

Accordingly, the depletion layer spreading from the PN junction does not spread beyond the P− layer 6 and does not become close to the P+ layer 7.

The first contact 11 using a tungsten plug for obtaining potential is provided on the P+ layer 7, and the first-layer wiring metal 13 (anode electrode) made of AlCu is provided. In addition, the second contact 12 using a tungsten plug for obtaining potential is provided on the N+ layer 5, and the first-layer wiring metal 14 (cathode electrode) made of AlCu is provided.

The avalanche photodiode is activated by applying application voltage to the first-layer wiring metal 13 (anode electrode) and the first-layer wiring metal 14 (cathode electrode).

According to the above-describe second embodiment, with the introduction of the P− layer 6, the DCR becomes stable without causing the depletion layer to become close to the surface. In addition, the electric field intensity on the lateral surface of the P-well layer 3 is alleviated by the polysilicon electrode 20 formed, with the insulating film 10 provided therebetween, on the front side of the lateral surface of the P-well layer 3, thereby controlling the electric field intensity immediately below the P-well layer 3, which occupies a large area, to be strongest. Accordingly, the sensitivity and amplification factor of the avalanche photodiode can be increased.

The avalanche photodiode according to the above-described second embodiment has the same advantageous effects as those of the avalanche photodiode according to the first embodiment.

In addition, the electric field intensity on the lateral side of the P-well layer 3 can be controlled by controlling voltage applied to the polysilicon electrode 20, which is formed, with the insulating film 10 provided therebetween, on a region that is on the lateral side of the P-well layer 3 of the silicon substrate 1 and that is between the first contact 11 and the second contact 12, thereby increasing the sensitivity and amplification factor of the avalanche photodiode.

Third Embodiment

The configuration of an avalanche photodiode according to a third embodiment of the present invention will be described with reference to FIG. 10.

Figure 10:
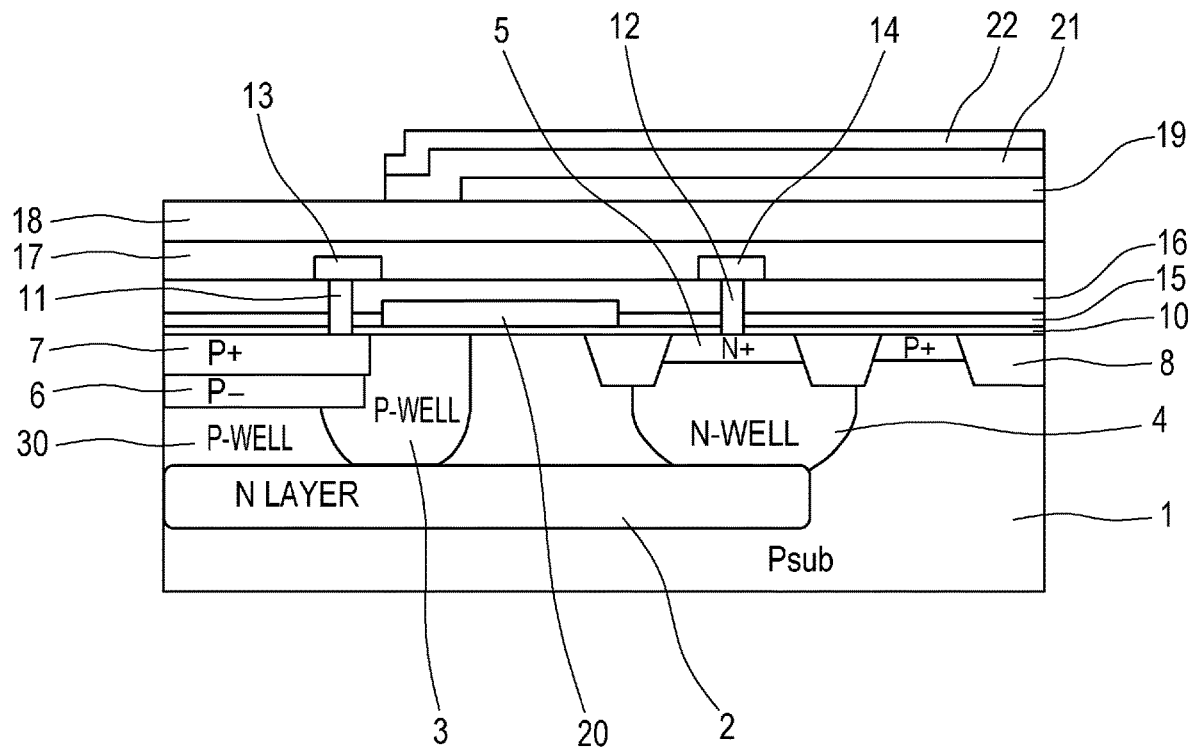
FIG. 10 is a diagram illustrating the cross-sectional structure of an avalanche photodiode according to a third embodiment of the present invention.
Figure 11:
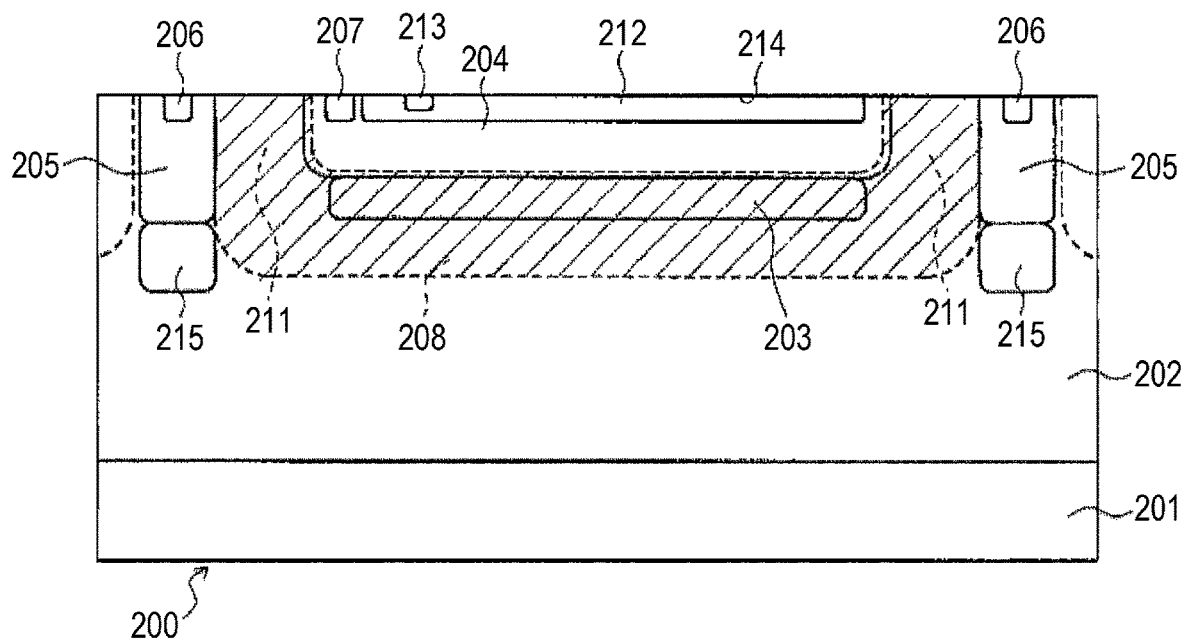
FIG. 11 is a diagram illustrating the cross-sectional structure of an avalanche photodiode according to PTL 1.

FIG. 10 is a cross-sectional view illustrating the configuration of the avalanche photodiode according to the third embodiment. In FIG. 10, the same configuration portion as that of the avalanche photodiode according to the second embodiment is given the same reference numeral.

As illustrated in FIG. 10, compared with the second embodiment, the avalanche photodiode according to the third embodiment includes the P-well layer 3 whose area is only around the light-receiving portion, and, by providing a second P-well layer 30 whose concentration is higher than the impurity concentration of the P-well layer 3, the electric field intensity immediately below the light-receiving portion can be increased.

The electric field intensity immediately below the light-receiving portion can be increased even by configuring the avalanche photodiode where nothing is formed immediately below the light-receiving portion.

Accordingly, the amplification factor in a large-area portion immediately below the light-receiving portion can be increased. In addition, because the electric field intensity immediately below the light-receiving portion can be controlled by the impurity concentration of the second P− well layer 30, the light-receiving sensitivity can be controlled by the concentration of the second P-well layer 30, which facilitates the design of the device.

Like the second embodiment, with the introduction of the P− layer 6, the DCR becomes stable without causing the depletion layer to become close to the surface. In addition, the electric field intensity on the lateral surface of the P-well layer 3 is alleviated by the polysilicon electrode 20 formed, with the insulating film 10 provided therebetween, on the front side of the lateral surface of the P-well layer 3, thereby controlling the electric field intensity immediately below the P-well layer 3, which occupies a large area, to be strongest. Accordingly, the sensitivity and amplification factor of the avalanche photodiode can be increased.

According to the above-described third embodiment, with the introduction of the highly-doped P+ layer 7 on the surface of the P-well layer 3 in the structure of activating in Geiger mode the avalanche photodiode using the PN junction including the P-well layer 3 and the N layer 2, the anode resistance can be reduced, and the contact resistance can be reduced. In addition, with the introduction of the P− layer 6 whose concentration is thinner than that of the P+ layer 7 but is higher than that of the P-well layer 3 in the P-well layer 3 immediately below the P+ layer 7 so as to avoid the influence of noise of the P+ layer 7, an avalanche photodiode capable of reducing the DCR can be provided.

The avalanche photodiode according to the above-described third embodiment has the same advantageous effects as those of the avalanche photodiode according to the first embodiment.

In addition, the electric field in the peripheral portion is reduced by arranging the polysilicon electrode 20, with the insulating film 10 provided therebetween, on the front side of the outer periphery of the P-well layer 3 around the light-receiving portion, thereby increasing the electric field immediately below the light-receiving portion of the device and increasing the amplification factor.

Furthermore, the advantageous effects of the present invention can be further enhanced by achieving the effect of increasing the amplification factor by introducing the second P-well layer 30, whose concentration is higher than that of the P-well layer 3 in the peripheral portion of the light-receiving portion, only immediately below the light-receiving portion.

<Method of Manufacturing Light-Receiving Portion>

Next, a method of manufacturing an avalanche photodiode according to the present invention will be described with reference to FIG. 9 illustrating the second embodiment.

As illustrated in FIG. 9, the selective oxide film STI (shallow trench isolation) 8 for isolating the device by electrically insulating between the anode and the cathode and between photodiodes on the upper surface of the P-type silicon substrate 1, which is made of Silicon (Si) with a specific resistance of about 10 Ωcm, is formed.

Next, a thick resist with a thickness of about 5 μm is formed on the entire surface. Using photolithography techniques or the like, the resist in a desired region where a photodiode is to be formed is removed. Using the resist as a mask, phosphorus ions, which serve as N-type impurities, are implanted into the P-type silicon substrate 1 under the condition that the acceleration energy is 720 keV and the implantation amount is about $1 \times 10^{13}$ cm$^{-2}$. At this time, the phosphorous impurities are introduced to a desired depth from the surface of the P-type silicon substrate 1 to form the N layer 2 whose peak concentration is about $2 \times 10^{17}$ cm$^{-3}$.

Next, the P-well layer 3 is formed at a certain position that is to be the anode electrode of the P-type silicon substrate 1. When it is necessary to form other photodiodes, these photodiodes are formed at the same time. Using photolithography techniques or the like, boron, which is a P-type impurity, is selectively and continuously introduced into the P-well layer 3 at a certain position on a region that is to be the N layer 2 by changing the implantation energy of an ion implanter. For example, the impurity concentration peak is set at a certain depth (such as about 2 μm) by implanting ions at multi-levels, and these levels are, for example, 250 keV and the implantation amount $5 \times 10^{12}$ cm$^{-2}$, and 50 keV and the implantation amount $5 \times 10^{12}$ cm$^{-2}$. The impurity concentration of the P-well layer 3 is, for example, about $1 \times 10^{17}$ cm$^{-3}$. Next, the N-well layer 4 is formed at a desired position that is to be the cathode electrode.

Next, after thermal processing for forming the insulating film 10 of about 30 nm, the polysilicon electrode 20 using polysilicon is formed on the insulating film 10 at a desired position between the anode contact and the cathode contact. This is to achieve the effect of stabilizing the potential on the surface of the P-type silicon substrate 1 and stabilizing the breakdown voltage of the avalanche photodiode.

Next, diffusion layers that are for extracting the anode contact and the cathode contact are formed. In the step of forming the diffusion layers, the P+ layer 7 and the N+ layer 5 are formed so that the peak concentration becomes high such as $1 \times 10^{21}$ cm$^{-3}$ by implanting ions at, for example, 5 keV and with an implantation amount of about $3 \times 10^{15}$ cm$^{-2}$. These diffusion layers are formed with a high concentration in order to establish ohmic-connection with the first and second contacts 11 and 12 for extracting the anode and cathode electrodes. Next, the P− layer 6 according to the present invention, which is a diffusion layer that is to be a stopper of the depletion layer, is ion-implanted at the boundary between the P-well layer 3 and the P+ layer 7 at 35 keV and with an implantation amount of $5 \times 10^{133}$ cm$^{-2}$, and lamp annealing at about 1000° C. is applied for about 25 seconds to have a peak concentration of about $5 \times 10^{18}$ cm$^{-3}$.

Because the impurity concentration and depth of the P-well layer 3, the P+ layer 7, the P− layer 6, and the N layer 2, which are immediately below the above-mentioned light-receiving portion, greatly influence the sensitivity spectrum of a finally-formed photodiode, optimization is done to achieve the target performance (such as the sensitivity spectrum).

Next, the insulating film 10 is formed of an oxide film on the upper surface of the P-type silicon substrate 1 where the device is formed, and the plasma SIN film 15 and the BPSG film 16 are formed on the insulating film 10. The first and second contacts 11 and 12 are formed in certain regions.

Next, after forming a metal film made of Ti/TiN and AlCu or the like on the upper surface of the BPSG film 16, the first-layer wiring metal 13 (anode electrode) and the first-layer wiring metal 14 (cathode electrode) are formed by patterning using photolithography techniques, etching techniques, and the like. Next, the inter-layer HDP film 17 and the inter-layer TEOS 18 are formed on the BPSG film 16 where the first-layer wiring metals 13 and 14 are formed. (Furthermore, in the case of implementing multi-layer wiring, the same steps as the wiring step (13 and 14) and the inter-layer step (17 and 18) are repeated to form a multi-layer wiring structure.) Furthermore, a light-shielding film is formed on the upper layer by utilizing the second-layer wiring metal 19 to shield a region other than that of the light-receiving area of the photodiode.

Although not illustrated, the P-type silicon substrate 1 and the polysilicon electrode 20 are connected by wiring and are both connected to a ground potential. For example, a certain potential such as about 15 V is applied to the first-layer wiring metal 14 (cathode electrode) such that the device functions as an avalanche photodiode. A signal processing circuit is connected to the first-layer wiring metal 13 (anode electrode) to detect photo-current generated by photon incidence or the like and to perform signal processing. Although the polysilicon electrode 20 may be connected to any of the above-mentioned three potentials, if the polysilicon electrode 20 is connected to the first-layer wiring metal 14 (cathode electrode), the surface of silicon between the first-layer wiring metals 13 and 14 acts to weaken the electric field intensity, and the effect of suppressing edge breakdown can be expected. Note that the configuration is not limited to the above configuration, and it may be configured to change potential independently from one another.

Thereafter, after forming the cover oxide film 21 and the cover SIN film 22 using silicon nitride films on the upper surface of the inter-layer TEOS 18 and the second-layer wiring metal 19, it is preferable to remove the cover oxide film 21 and the cover SIN film 22 on the light-receiving portion in order to form apertures. Accordingly, inorganic material films on the photodiode become a single oxide film, which is effective for suppressing variations in light reflection on the photodiode.

Note that the representation of P-type and N-type in the above-described first to third embodiments are representative examples, and the device can be configured even in the case where the conductivity types are opposite. Compared with the case where the conductivity types are opposite, the device can be more easily integrated as LSI (large-scale integration circuit) in the case of integrating the device as LSI.

Although the avalanche photodiode using the silicon substrate 1 has been described in the above-described first to third embodiments, the substrate is not limited to a silicon substrate, and a substrate made of another material may be used.

The present invention is not limited to the above-described embodiments, and various modifications are possible within the scope of the claims. An embodiment obtained by appropriately combining technical means disclosed in different embodiments is also included in the technical scope of the present invention. Also, a new technical feature may be obtained by combining technical means disclosed in the embodiments.

The present invention and the embodiments are summarized as follows.

An avalanche photodiode according to the present invention includes:

a first semiconductor layer 3 of a first conductivity type formed on a substrate of the first conductivity type;

a second semiconductor layer 2 of a second conductivity type opposite from the first conductivity type, the second semiconductor layer 2 being formed under the first semiconductor layer 3;

a third semiconductor layer 7 of the first conductivity type formed in a shallow portion of the first semiconductor layer 3 on the substrate, the third semiconductor layer 7 having a higher concentration than an impurity concentration of the first semiconductor layer 3;

a fourth semiconductor layer 6 of the first conductivity type formed in a region in the first semiconductor layer 3 immediately below the third semiconductor layer 7;

a first contact 11 electrically connected to the first semiconductor layer 3; and a second contact 12 electrically connected to the second semiconductor layer 2, wherein an impurity concentration of the fourth semiconductor layer 6 is higher than that of the first semiconductor layer 3 and lower than that of the third semiconductor layer 7.

According to the above-described configuration, in response to application of high voltage across the first semiconductor layer 3 and the second semiconductor layer 2, a depletion layer spreads to the first semiconductor layer 3 and the second semiconductor layer 2. However, because there is the fourth semiconductor layer 6 of the first conductivity type, the depletion layer does not spread to the third semiconductor layer 7, which is formed on the substrate surface and which has a high impurity concentration, and the depletion layer does not directly contact the third semiconductor layer 7. Accordingly, the dark count rate does not increase even when the third semiconductor layer 7 is formed with a high concentration in a shallow region on the surface in order to reduce the anode resistance. Therefore, leakage can be suppressed, and good dark count rage characteristics can be achieved.

In addition, an avalanche photodiode according to an embodiment includes:

an electrode 20 formed, with an insulating film 10 provided therebetween, on a region that is on a lateral side of the first semiconductor layer 3 on the substrate and that is between the first contact 11 and the second contact 12.

According to the above-described embodiment, the electric field intensity on the lateral side of the first semiconductor layer 3 can be controlled by controlling voltage applied to the electrode 20, which is formed, with the insulating film 10 provided therebetween, on a region that is on the lateral side of the first semiconductor layer 3 of the silicon substrate 1 and that is between the first contact 11 and the second contact 12, thereby increasing the sensitivity and amplification factor of the avalanche photodiode.

In addition, in an avalanche photodiode according to an embodiment, the substrate 1 is the silicon substrate 1 of the first conductivity type, and the impurity concentration of the third semiconductor layer 7 exceeds solid solubility into silicon.

According to the above-described embodiment, it is preferable that the third semiconductor layer 7 for reducing the anode resistance, which is formed on the surface of the silicon substrate 1, be subjected to ion implantation exceeding the solid solubility into silicon in order to secure a sufficient impurity concentration.

In addition, in an avalanche photodiode according to an embodiment, the impurity concentration of the fourth semiconductor layer 6 is a concentration not exceeding solid solubility.

According to the above-described embodiment, because the impurity concentration of the fourth semiconductor layer 6 is a concentration that does not cause segregation of impurities due to ion implantation exceeding the solid solubility, recombination current caused by defects due to segregated impurities does not occur, and the dark count rate is not deteriorated even when the depletion layer contacts the fourth semiconductor layer 6.

In addition, in an avalanche photodiode according to an embodiment, it is configured such that a depletion layer does not spread beyond the fourth semiconductor layer toward the third semiconductor layer.

According to the above-described embodiment, by controlling the width of the depletion layer such that the depletion layer does not spread beyond the fourth semiconductor layer 6 toward the third semiconductor layer 7, the electric field intensity can be controlled, and the stable amplification factor can be secured.

INDUSTRIAL APPLICABILITY

An avalanche photodiode according to the present invention can be used as a light-receiving device in various optical sensors.

REFERENCE SIGNS LIST 1 silicon substrate
2 N layer
3 P-well layer
4 N-well layer
5 N+ layer
6 P− layer
7 P+ layer
8 selective oxide film STI
10 insulating film
11 first contact
12 second contact
13 first-layer wiring metal (anode electrode)
14 first-layer wiring metal (cathode electrode)
15 plasma SIN film
16 BPSG film
17 inter-layer HDP film
18 inter-layer TEOS 19 second-layer wiring metal
20 polysilicon electrode
21 cover oxide film
22 cover SIN film
30 second P-well layer

The invention claimed is:

1. An avalanche photodiode comprising:
a first semiconductor layer of a first conductivity type formed on a substrate of the first conductivity type;
a second semiconductor layer of a second conductivity type opposite from the first conductivity type, the second semiconductor layer being formed under the first semiconductor layer;
a third semiconductor layer of the first conductivity type formed in a shallow portion of the first semiconductor layer on the substrate, the third semiconductor layer having a higher concentration than an impurity concentration of the first semiconductor layer;
a fourth semiconductor layer of the first conductivity type formed in a region of the first semiconductor layer immediately below the third semiconductor layer;
a first contact electrically connected to the first semiconductor layer;
a second contact electrically connected to the second semiconductor layer; and
an electrode formed, with an insulating film provided therebetween, on a region that is on a lateral side of the first semiconductor layer on the substrate and that is between the first contact and the second contact,
wherein an impurity concentration of the fourth semiconductor layer is higher than the impurity concentration of the first semiconductor layer and lower than an impurity concentration of the third semiconductor layer,
the second semiconductor layer does not contact the insulating film, and
the electrode is in direct contact with the insulating film.

2. The avalanche photodiode according to claim 1, wherein:
the substrate is a silicon substrate of the first conductivity type, and
the impurity concentration of the third semiconductor layer exceeds solid solubility into silicon.

3. The avalanche photodiode according to claim 1, wherein:
the impurity concentration of the fourth semiconductor layer is a concentration not exceeding solid solubility.

4. The avalanche photodiode according to claim 1, further comprising:
a depletion layer that does not spread beyond the fourth semiconductor layer toward the third semiconductor layer.

5. An avalanche photodiode comprising:
a first semiconductor layer of a first conductivity type formed on a substrate of the first conductivity type;
a second semiconductor layer of a second conductivity type opposite from the first conductivity type, the second semiconductor layer being formed under the first semiconductor layer;
a third semiconductor layer of the first conductivity type formed in a shallow portion of the first semiconductor layer on the substrate, the third semiconductor layer having a higher concentration than an impurity concentration of the first semiconductor layer;
a fourth semiconductor layer of the first conductivity type formed in a region of the first semiconductor layer immediately below the third semiconductor layer;
a first contact electrically connected to the first semiconductor layer;
a second contact electrically connected to the second semiconductor layer; and
an electrode formed, with an insulating film provided therebetween, on a region that is on a lateral side of the first semiconductor layer on the substrate and that is between the first contact and the second contact,
wherein an impurity concentration of the fourth semiconductor layer is higher than the impurity concentration of the first semiconductor layer and lower than an impurity concentration of the third semiconductor layer,
an impurity concentration of the second semiconductor layer is higher than the impurity concentration of the first semiconductor layer and lower than the impurity concentration of the third semiconductor layer,
the second semiconductor layer does not contact the insulating film, and
the electrode is in direct contact with the insulating film.

* * * * *